(12) United States Patent
Lee

(10) Patent No.: US 9,620,522 B1
(45) Date of Patent: Apr. 11, 2017

(54) METHOD OF MANUFACTURING SEMICONDUCTOR DEVICE

(71) Applicant: SK hynix Inc., Icheon-si, Gyeonggi-do (KR)

(72) Inventor: Hyun Ho Lee, Icheon-si (KR)

(73) Assignee: SK HYNIX INC., Icheon-Si (KR)

(*) Notice: Subject to any disclaimer, the term of this patent is extended or adjusted under 35 U.S.C. 154(b) by 0 days.

(21) Appl. No.: 15/052,024

(22) Filed: Feb. 24, 2016

(30) Foreign Application Priority Data

Oct. 1, 2015 (KR) .................. 10-2015-0138596

(51) Int. Cl.
*H01L 21/28* (2006.01)
*H01L 27/11582* (2017.01)

(52) U.S. Cl.
CPC .. *H01L 27/11582* (2013.01); *H01L 21/28282* (2013.01)

(58) Field of Classification Search
None
See application file for complete search history.

(56) References Cited

U.S. PATENT DOCUMENTS

2012/0108048 A1\* 5/2012 Lim ............... H01L 27/11529
438/586
2014/0199815 A1\* 7/2014 Hwang ............ H01L 29/66833
438/270

FOREIGN PATENT DOCUMENTS

KR 1020110001527 A 1/2011
KR 1020140093116 A 7/2014

\* cited by examiner

*Primary Examiner* — Khaja Ahmad
(74) *Attorney, Agent, or Firm* — William Park & Associates Ltd.

(57) ABSTRACT

The present disclosure provides a method of manufacturing a three dimensional memory device to suppress warpage of conductive patterns. The method may include providing a multilayered structure in which different material layers are alternately stacked over a substrate, etching partially the material layers to form a multi-step structure, each step being formed of at least one pair of the material layers, forming vertical support layers, each support layer being disposed on a top face of each step, removing partially the material layers to form recesses, filling the recesses with a conductive material to form gate lines, the gate line defining an upper portion of the step, and forming vertical contact plugs respectively on the upper portion of the step.

16 Claims, 16 Drawing Sheets

METHOD OF MANUFACTURING SEMICONDUCTOR DEVICE

CROSS-REFERENCE TO RELATED APPLICATION

The present application claims a priority under 35 U.S.C. §119(a) to a Korean patent application number 10-2015-0138596 filed on Oct. 1, 2015, in the Korean Intellectual Property Office, the entire disclosure of which is incorporated herein by reference.

BACKGROUND

1. Technical Field

Embodiments of the present disclosure generally relates to a method for manufacturing a memory device, and, more particularly, to a method for manufacturing a three dimensional non-volatile memory device.

2. Related Arts

Semiconductor devices may include a memory device. The memory device may include a volatile memory device and a non-volatile memory device. The volatile memory device is a memory device that requires power to maintain its data. The non-volatile memory device may retain its data even when power is shut off or interrupted. For this reason, the non-volatile memory device is being widely used in a mobile device.

The memory device may include a memory cell array to store data therein, a peripheral circuit to program, read and erase data into/from the array, and a control logic to control the peripheral circuit.

The memory cell array may include a plurality of memory blocks. In order to highly integrate the memory device, the memory cell array may have a three dimensional structure. The memory cell array having the three dimensional structure may include vertical memory cell strings. Each memory cell string may include vertically arranged memory cells on a substrate.

Each vertical memory cell string may be disposed between bit lines and a source line. The vertical memory cell strings may include vertical channel layers. Word lines may be coupled to memory cells of the vertical memory cell strings, respectively.

Recent demands for high-density memory device have required that a height of the vertical memory cell string be increased. This may result in difficulty of manufacturing the memory device.

SUMMARY

The present disclosure provides a method of manufacturing a three-dimensional memory device to suppress warpage of conductive patterns.

In an embodiment of the present disclosure, a method of manufacturing a semiconductor device may include providing a multilayered structure in which different material layers are alternately stacked over a substrate, etching partially the material layers to form a multi-step structure, each step being formed of at least one pair of the material layers, forming vertical support layers, each support layer being disposed on a top surface of each step, removing partially the material layers to form recesses, filling the recesses with a conductive material to form gate lines, the gate line defining an upper portion of the step, and forming vertical contact plugs respectively on the upper portion of the step.

In an embodiment, a method of manufacturing a memory device may include providing a multilayered structure in which first and second material layers are alternately stacked over a substrate, the substrate being divided into cell and slimming regions, etching partially the first and second material layers in the slimming region to form a multi-step structure, each step including the second material having a partially exposed top surface, forming a first interlayer insulating layer to cover the multi-step structure, etching partially the first interlayer insulating layer to form first slits, each first slit partially exposing a top surface of the second material of each step, filling the first slits to form first support layers, forming second slits in the cell and slimming regions, the second slits exposing sidewalls of the first and second material layers, removing the second material layers through the second slits to form recesses, filling the recesses with third material layers to form gate lines, each of the third material layers defining an upper portion of each step, forming contact holes, each contact hole partially exposing the upper portion of each step, and filling the contact holes with a conductive material to form contact plugs.

In an embodiment, a method of manufacturing a memory device may include forming a multi-step structure; forming first slits exposing top surfaces of the steps of the multi-step structure; filling the first slits with first interlayer insulating layers to form vertical support layers, wherein the vertical support layers are disposed on top surfaces of the steps; forming second slits along the direction to which the vertical support layers are arranged, the second slits exposing first side walls of the vertical support layers; filling the second slits with second interlayer insulating layers; forming contact holes exposing second side walls of the vertical support layers; and forming conductive layers in the contact holes.

DETAILED DESCRIPTIONS

Figure 1:
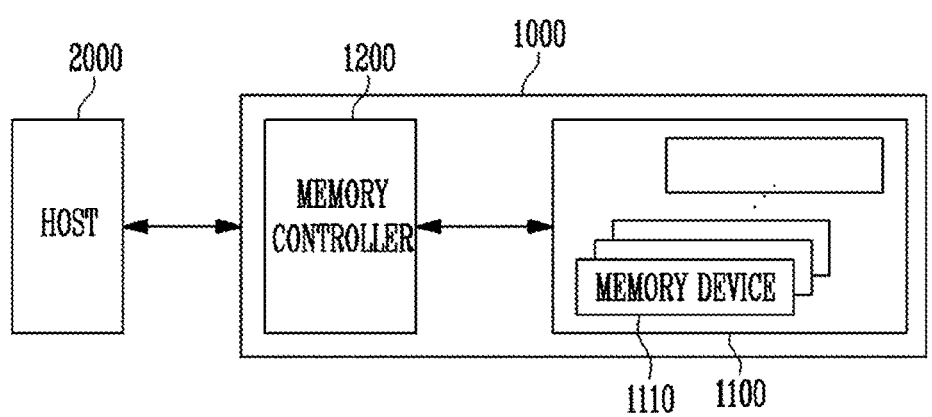
FIG. 1 is a diagram illustrating an example of a memory system in accordance with an embodiment of the present disclosure.

Examples of various embodiments are illustrated in the accompanying drawings and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, operations, elements, and/or components, but do not preclude the presence or addition of one or more other features, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

FIG. 1 is a diagram illustrating a memory system according to an embodiment of the present disclosure.

Referring to FIG. 1, the memory system 1000 may include a memory device 1100 which may store data therein and a memory controller 1200 which may control the memory device 1100.

The memory device 1100 may include a plurality of memory devices 1110. The memory devices 1110 may include one or more of a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), and a flash memory. Hereinafter, the memory device 1110 including a NAND flash memory is provided as an example.

The memory controller 1200 may control operations of the memory device 1100 and, in a respond to a command from a host 2000, may provide a command, address, and data to the memory device 1100 or receive data from the memory device 1100.

The host 2000 may communicate with the memory system 1000 via an interface protocol such as a Peripheral Component Interconnect-Express (PCI-E), an Advanced Technology Attachment (ATA), a Serial ATA (SATA), a Parallel ATA (PATA), or a SAS serial attached SCSI.

Figure 2:
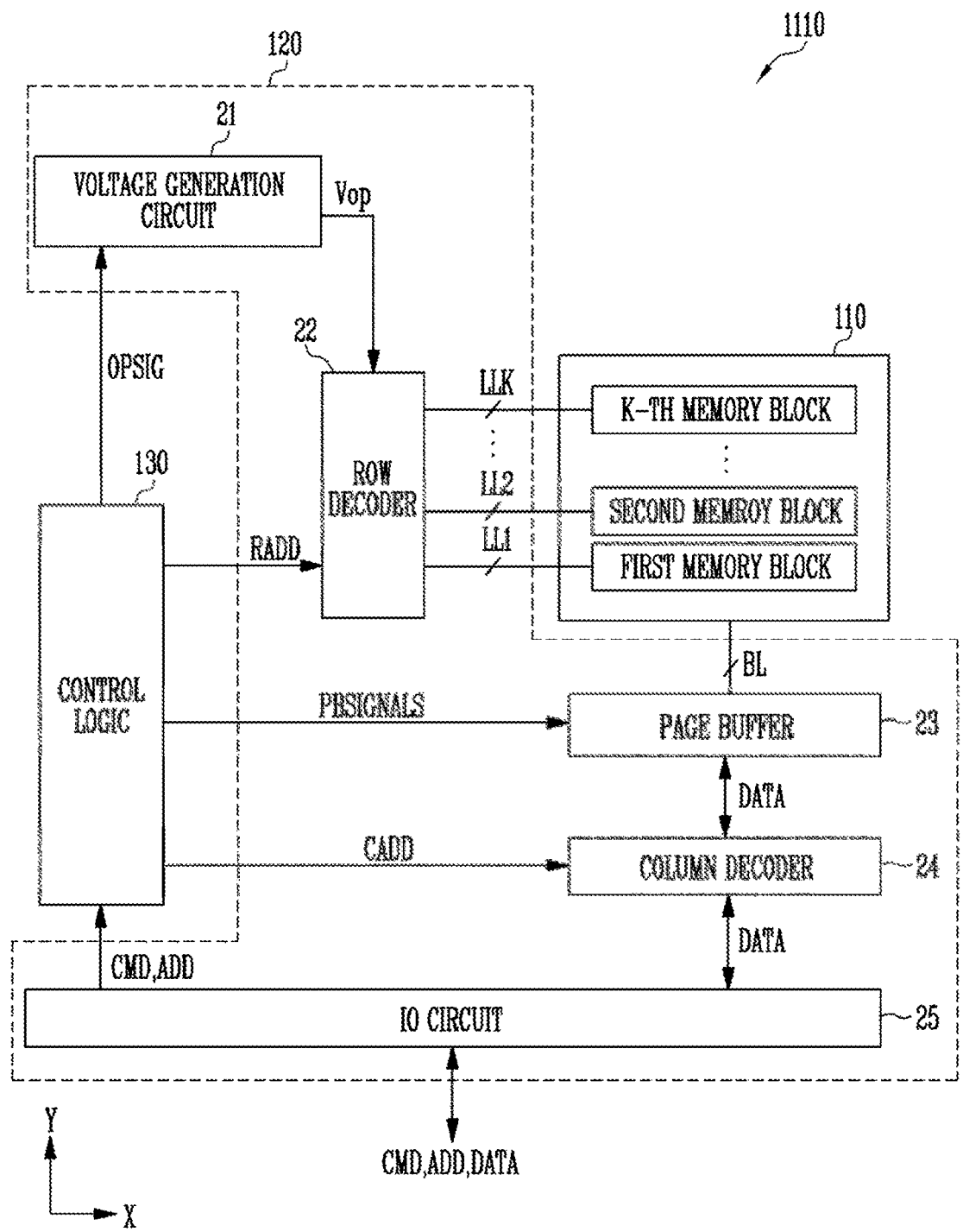
FIG. 2 is a diagram illustrating an example of the memory device in FIG. 1.

FIG. 2 is a diagram illustrating the memory device in FIG. 1.

Referring to FIG. 2, the memory device 1110 may include a memory cell array 110 which may store data therein, a peripheral circuit 120 which may perform a programming, reading or erasing operation for the memory cell array 110, and a control logic 130 which may control the peripheral circuit 120.

The memory cell array 110 may include first to $K^{th}$ memory blocks (where K is a positive integer), and the memory blocks may have the same configuration. The first to $K^{th}$ memory blocks may have a three-dimensional structure. Each of the first to $K^{th}$ memory blocks may be coupled to each of first to $K^{th}$ local lines LL1 to LLK.

The peripheral circuit 120 may include a voltage generation circuit 21, a row decoder 22, a page buffer 23, a column decoder 24, and an input/output circuit 25.

The voltage generation circuit 21 may generate a variety of levels of operation voltages Vop in response to an operation signal OPSIG. The voltage generation circuit 21 may selectively apply the generated operation voltages Vop to global lines. In an example, in response to a programming operation signal OPSIG, the voltage generation circuit 121 may generate a programming voltage, a programming pass voltage, and a programming verification voltage, which are used during a programming operation. In response to a reading operation signal OPSIG, the voltage generation circuit 121 may generate a reading voltage and a reading pass voltage, which are used during a reading operation. In response to an erasing operation signal OPSIG, the voltage generation circuit 21 may generate an erasing voltage and an erasing verification voltage, which are used during an erasing operation.

The row decoder 22 may deliver the operation voltage Vop to the local lines coupled to the memory block selected between the first to $K^{th}$ local lines LL1 to LLK in response to a row address RADD. Further, the row decoder 22 may be coupled via the global lines to the voltage generation circuit 21. Thus, The row decoder 22 may deliver the operation voltage Vop from the global lines to the local lines coupled to the selected memory block The page buffer 23 may be coupled via bit-lines BL to the memory cell array 110, and may precharge the bit-lines BL to a certain positive voltage in response to a page buffer control signal PBSIGNALS, or may communicate data with the selected memory block in the programming or reading operation, or may temporarily store data therein.

The column decoder 24 may communicate data DATA with the page buffer 23 in response to a column address CADD, or may communicate data DATA with the input/output circuit 25.

The input/output circuit 25 may deliver command CMD and address ADD from an external device, for example, the memory controller 1200 to the control circuit 130, or deliver data DATA from the external device to the column decoder 124, or output data DATA from the column decoder 124 to the external device.

The control logic 130 may control the peripheral circuit 120 in response to a receipt of the command CMD and address ADD. For example, in response to the command CMD and address ADD, the control logic 130 may output the operation signal OPSIG, row address RADD, page buffer control signal PBSIGNALS, and column address CADD to control the peripheral circuit 120.

The first to $K^{th}$ memory blocks may have a three-dimensional structure. The first to $K^{th}$ memory blocks may have the same configuration, and thus a single memory block among them is described below.

Figure 3:
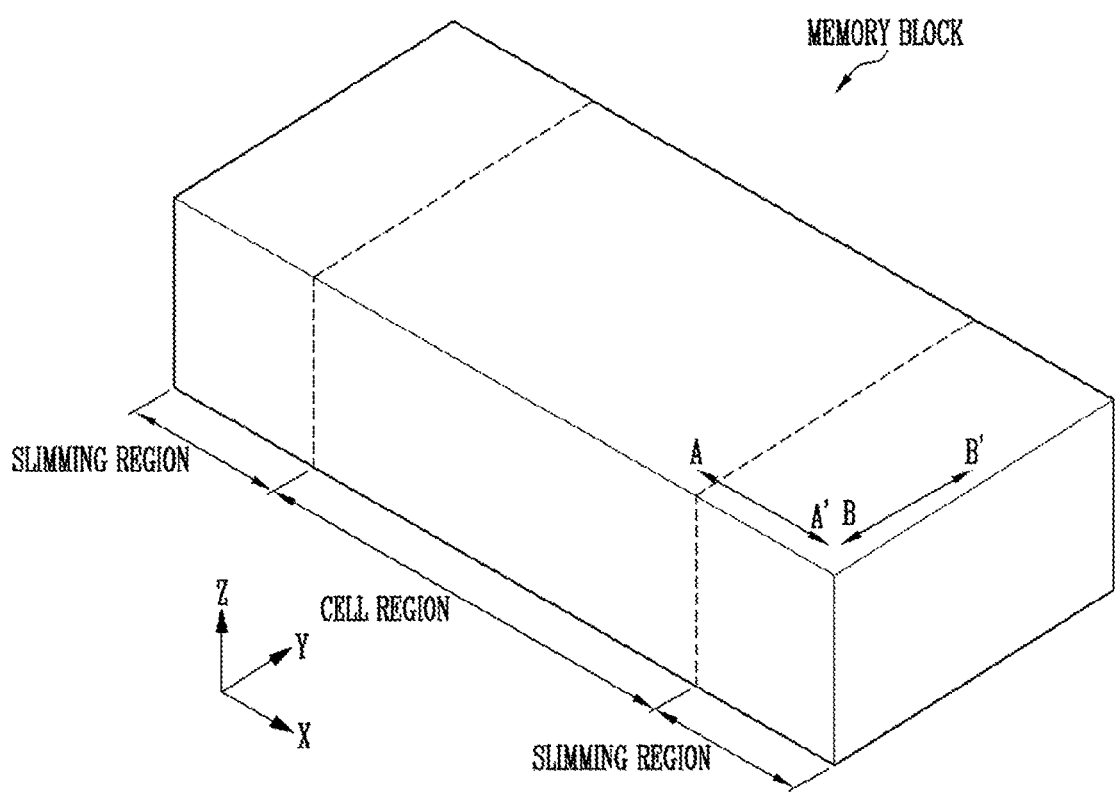
FIG. 3 is a diagram illustrating an example of a memory block in accordance with an embodiment of the present disclosure.

FIG. 3 illustrates an example of a memory block in accordance with an embodiment of the present disclosure.

Referring to FIG. 3, a three dimensional memory block may include a cell region and slimming regions. The cell region may include memory cells storing data. Each of the slimming regions may include plugs connecting the local lines including word lines and the peripheral circuits to each other. The slimming regions and cell regions may be arranged in a first direction, for example, in a X direction. Both slimming regions may be coupled respectively to both ends of a single cell region.

A method of manufacturing a slimming region will be described below with reference to a cross section taken in an A-A' direction and a layout of A-A' and B-B' directions.

FIG. 4 to FIG. 15 respectively illustrate cross-sectional views of partially-manufactured memory devices at respective stages of a method of manufacturing a memory device in accordance with an embodiment of the present disclosure. Hereinafter, a memory device having U-shaped strings in a cell region will be described, but the present disclosure is not limited thereto.

Figure 4:
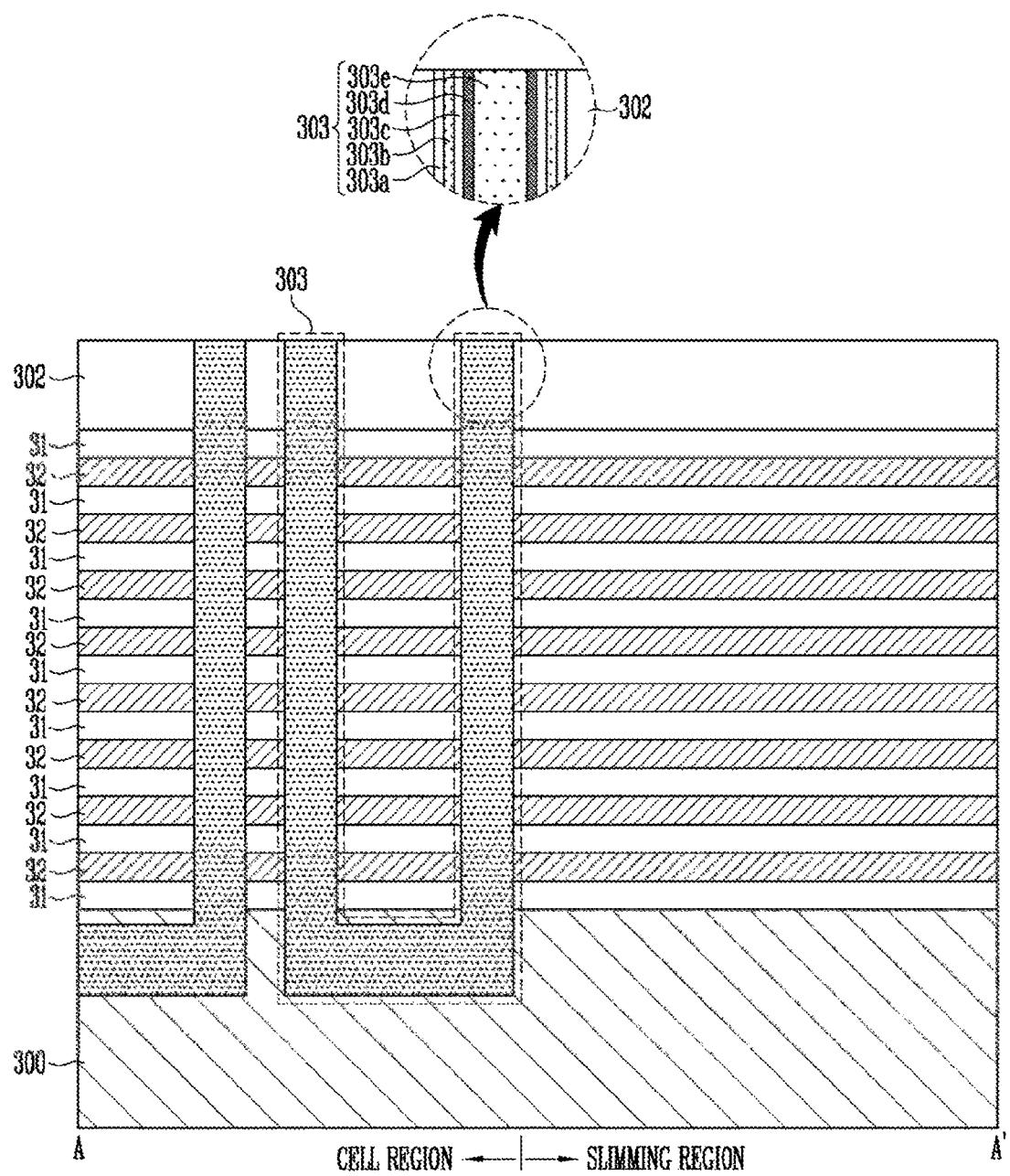
FIG. 4 to FIG. 15 are cross-sectional views respectively illustrating examples of partially-manufactured memory devices at respective stages of a method for manufacturing a memory device in accordance with an embodiment of the present disclosure.

Referring to FIG. 4, first material layers 31 and second material layers 32 may be alternately stacked over a substrate 300 having a cell region and a slimming region. A hard mask 302 may be formed over a topmost first material layer 31. In the cell region, vertical portions of a U-shaped vertical structure 303 may pass through the hard mask 302 and first and second material layers 31 and 32. The U-shaped vertical structure 303 may have the vertical portions and a horizontal portion disposed in the substrate 300 and connected to the vertical portions at both ends thereof. For example, the first material layers 31 each may be made of an oxide layer, and the second material layers 32 each may be made of a sacrificial layer. The hard mask 302 may be made of an oxide layer.

The vertical structure 303 may a multilayered structure including one or more of a blocking layer 303a, a trapping layer 303b, a tunnel insulating layer 303c, a channel layer 303d, and a vertical insulating layer 303e. For example, the blocking layer 303a may be formed on an inner surface of a vertical hole passing through the first and second material layers 31 and 32. The trapping layer 303b may be formed on the blocking layer 303a, a tunnel insulating layer 303c may be formed on the trapping layer 303b, and the channel layer 303d may be formed on the tunnel insulating layer 303c. The vertical insulating layer 303e may fill a hollow portion of the channel layer 303d. In an example, the blocking layer 303a may be made of an oxide layer, the trapping layer 303b may be made of a nitride layer, the tunnel insulating layer 303c may be made of an oxide layer, the channel layer 303d may be made of a doped polysilicon layer, and the vertical insulating layer 303e may be made of a polysilazane (PSZ) layer.

Figure 5:
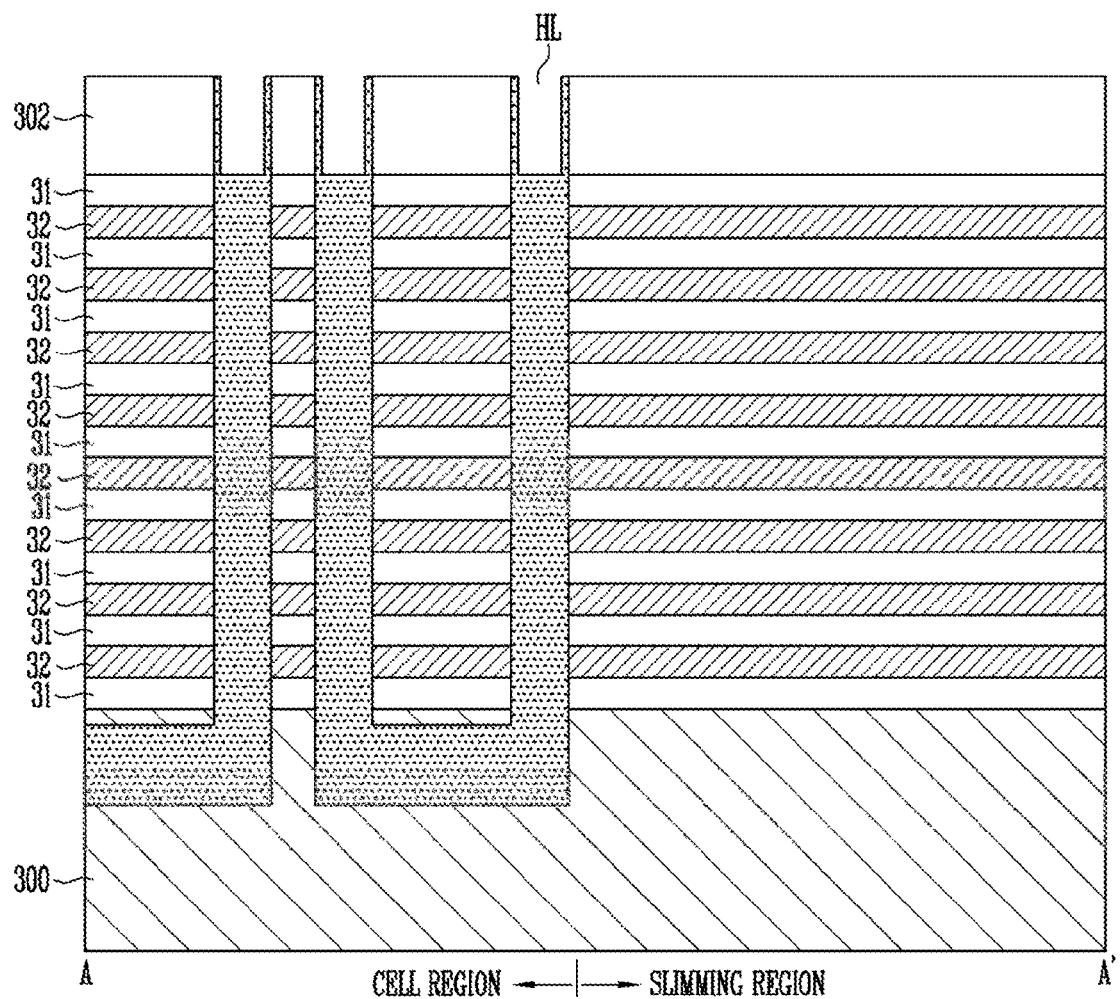

Referring to FIG. 5, the vertical insulating layer 303e may be partially removed at a top portion thereof to form vertical holes HL at a top region of the vertical structure 303. More specifically, the vertical holes HL may be formed by removing portions of the vertical structure 303 formed at the same height from the substrate 300 as the hard mask 302. For example, the portions of the vertical structure 303 formed at the same height from the substrate 300 as the hard mask 302 may be etched by using the hard mask 302 as an etch mask.

Figure 6:
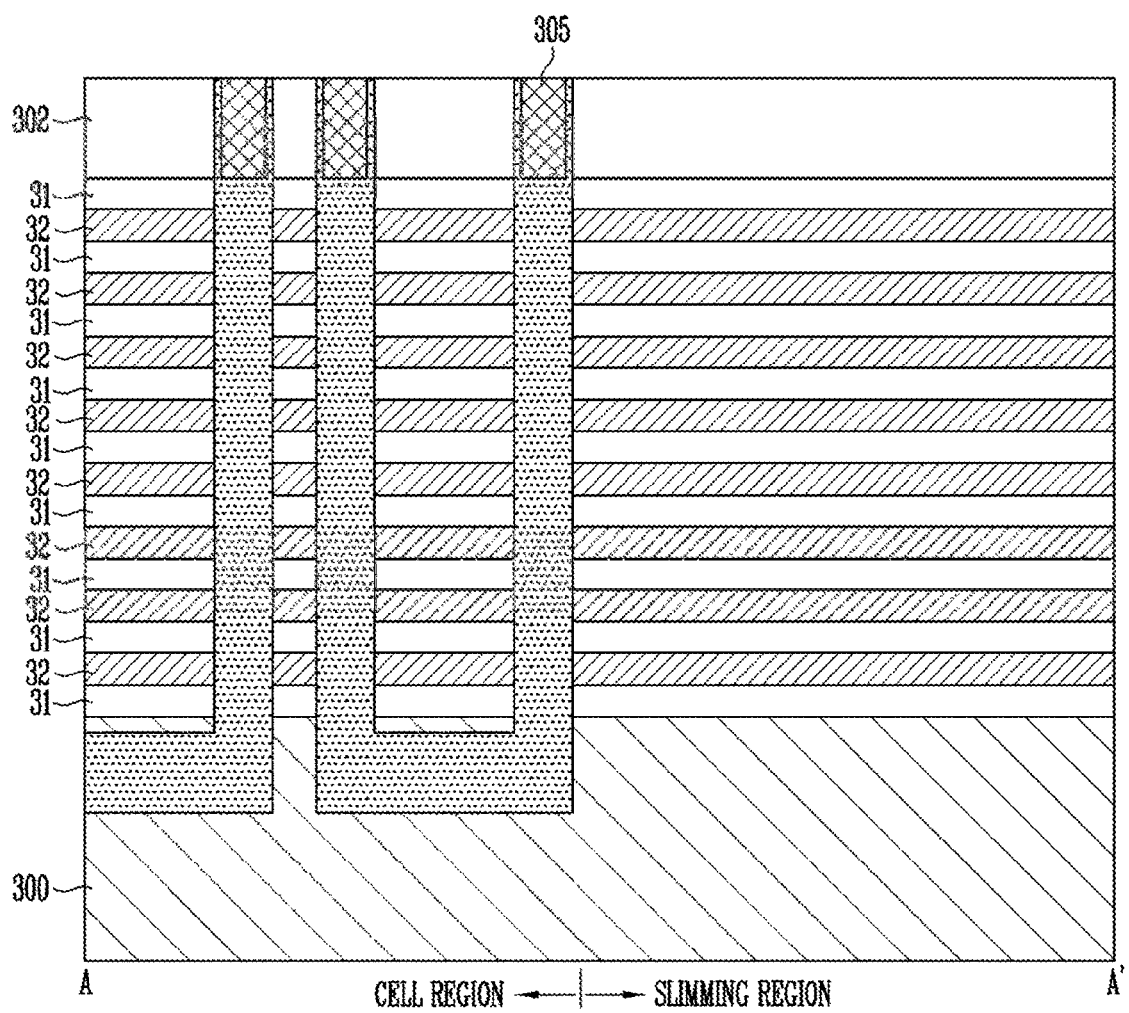

Referring to FIG. 6, a first conductive layer 305 may be formed in the vertical holes HL in FIG. 5. For example, the first conductive layer 305 may be formed to cover a surface of the resultant structure of the step illustrated in FIG. 5, and then parts of the first conductive layer 305 may be removed by performing a planarization process such as a chemical mechanical polishing (CMP) until the hard mask 302 is exposed. In this way, the first conductive layer 305 may remain in the vertical holes HL.

Figure 7:
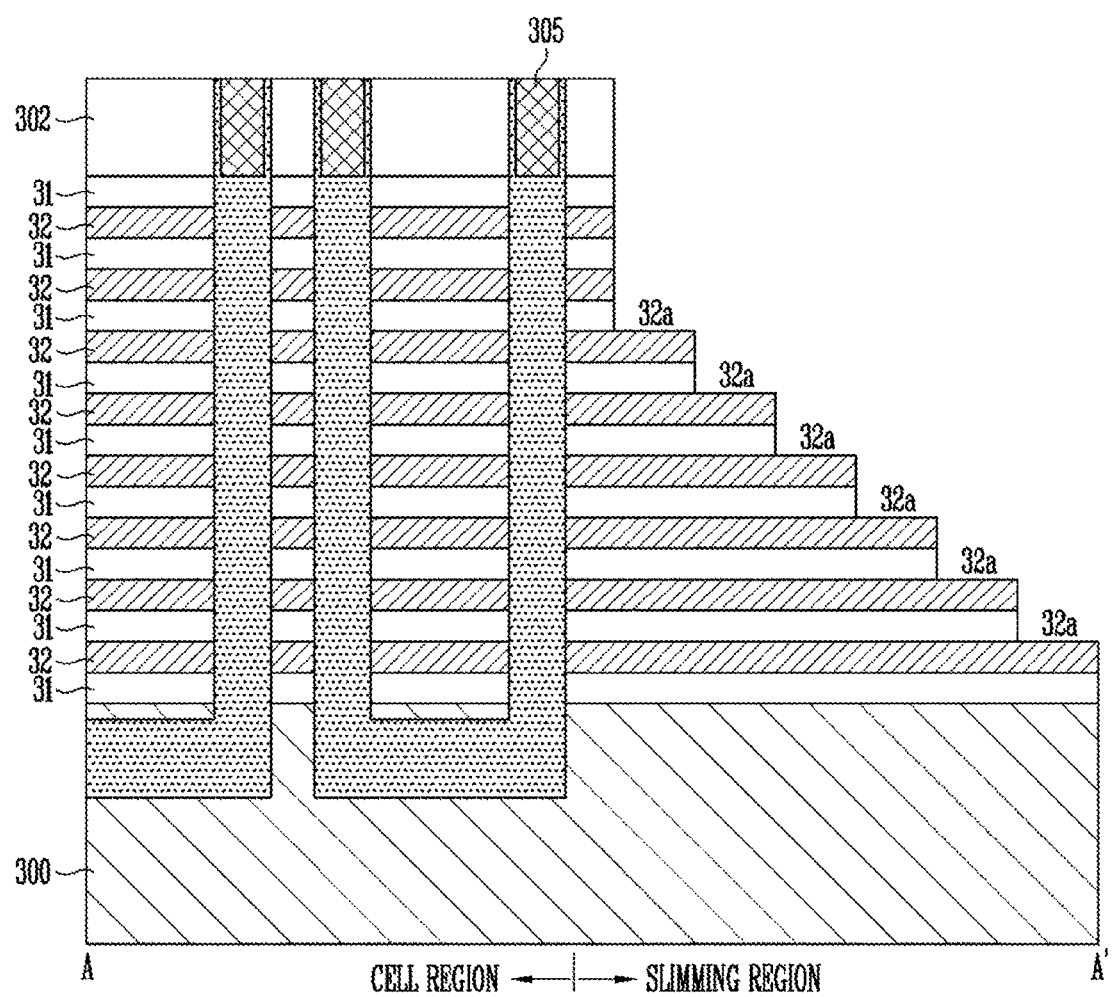

Referring to FIG. 7, a slimming operation may be carried out to form a multi-step structure in the slimming region. Each step of the multi-step structure may include a stack of a pair of the first and second material layers 31 and 32. The slimming operation may include a first etching operation to sequentially remove the first and second material layers 31 and 32 from the slimming region. The first etching operation may include a dry etching. For example, in the slimming region, the vertically adjacent first and second material layers 31 and 32 may be partially removed while partially exposing a top surface of each of the second material layers 32.

Figure 8:
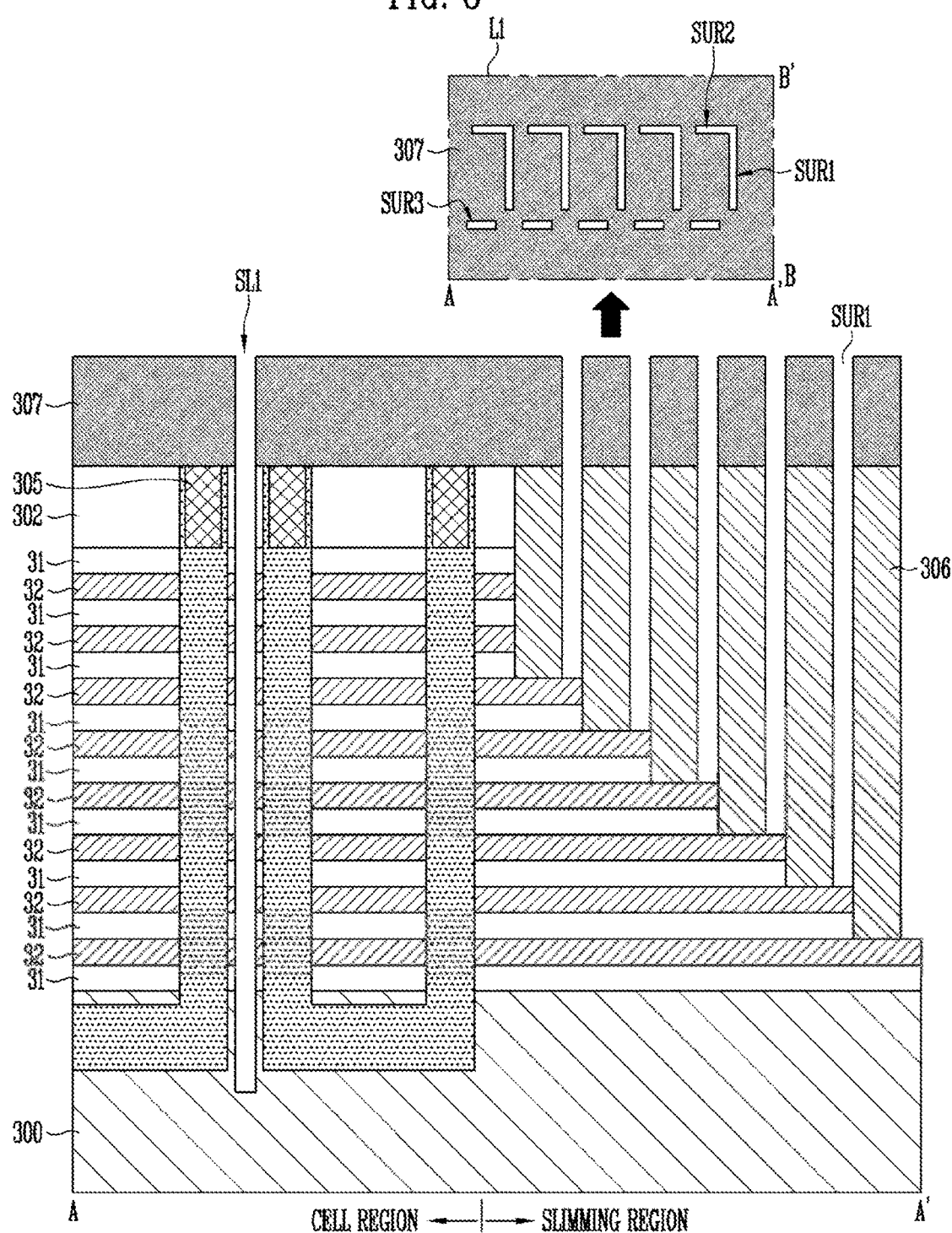

Referring to FIG. 8, a first interlayer insulating layer 306 may be formed over the entire resulting structure of the step illustrated in FIG. 7. In an example, the first interlayer insulating layer 306 may be made of an oxide layer. Next, a first slit mask pattern 307 may be formed over the first interlayer insulating layer 306. The first slit mask pattern 307 may include first to third openings SUR1, SUR2, and SUR3.

In the slimming region, the first slit mask pattern 307 may have a first layout L1 (e.g., A-A' and B-B' plane). For example, each of the first openings SUR1 may be formed where a first support layer region will be formed later. For example, in the slimming region, each of the first openings SUR1 may extend in a B-B' direction. The first openings SUR1 may be spacedly arranged in an A-A' direction. The lengths of the first openings SUR1 may be smaller than the widths of the first and second material layers 31 and 32. Each of the first openings SUR1 may partially superpose with a top surface of each step of the multi-step structure in the slimming region. Further, the first openings SUR1 may be formed between the memory blocks in the cell region.

The second openings SUR2 may be formed to avoid excessive etching of the insulating layer 306, which may otherwise occur in the slimming region during a subsequent process. Each of the second openings SUR2 may be coupled perpendicularly to one end of each of the first openings SUR1. For example, each of the second openings SUR2 may extend in the A-A' direction and may be coupled perpendicularly to an end of each of the first openings SUR1. The second openings SUR2 may be spacedly arranged in the A-A' direction. In this way, a combination of first and second openings SUR1 and SUR2 coupled to each other may form an L-shaped slit.

The third openings SUR3 may be respectively formed in an opposite side to the second openings SUR2 on the first layout L1. The third openings SUR3 FIG may be spaced apart from the first openings SUR1 and thus may not be coupled to the first openings SUR1. However, the present disclosure is not limited thereto. The third openings SUR3 FIG may be coupled to the first openings SUR1 like the second openings SUR2. The third openings SUR3 may also be formed to avoid excessive etching of the insulating layer 306 which may otherwise occur in the slimming region for a subsequent process.

Subsequently, using, as an etching mask, the first slit mask pattern 307 including the first to third openings SUR1 to SUR3, a second etching operation may be carried out to partially remove the exposed hard mask 302, the first and second material layers 31 and 32, and the substrate 300 in the cell region, and to partially remove the exposed first interlayer insulating layer 306 in the slimming region. The second etching operation may include a dry etching. In the second etching operation, a first slits SL1 may be formed. For example, in the cell region, the layers exposed through the first openings SUR1 may be etched to form the first slits SL1, and the depth of the first slits SL1 may be deeper than a bottom of the vertical structure 303 as shown in FIG. 8. In the slimming region, through the first to third openings SUR1 to SUR3, the first interlayer insulating layer 306 may be partially removed until the top surfaces (e.g., 32a in FIG. 7) of the second material layers 32 may be exposed. In this way, the first slits SL1 may be formed. Each of the first slits SL1 may have a trench form.

Figure 9:
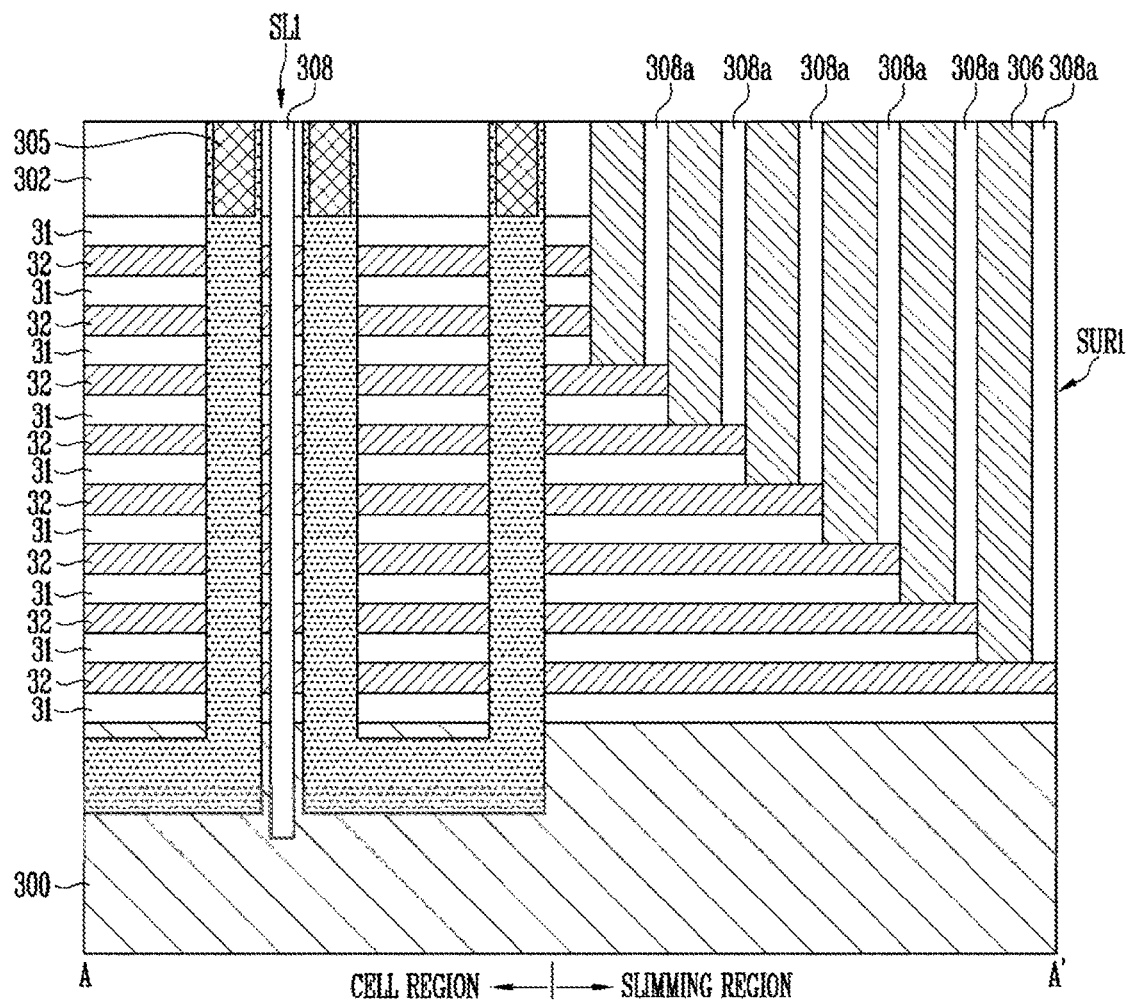

Referring to FIG. 9, in the first slit regions SL1, support layers 308 and 308a may be formed. The support layers 308 and 308a may be made of insulating materials. In an embodiment, the support layers 308 and 308a each may be made of an oxide layer having a different etching rate from that of the first interlayer insulating layer 306. For example, the support layers 308 and 308a may be made of an oxide layer having a lower etching rate than that of the first interlayer insulating layer 306. The support layer 308 may be formed in the cell region, while the support layer 308a may be formed in the slimming region. The support layers 308 and 308a may be made of the same material. Further, although not illustrated in FIG. 9, the insulating material may be formed in the second and third openings SUR2 and SUR3 in FIG. 8 at the same time as the first slit regions SL1. The insulating material formed in the second openings SUR2 may define a second support layer (308b in FIG. 10). The insulating material formed in the third openings SUR3 may define a third support layer (e.g., 308c in FIG. 10). These first to third support layers 308a, 308b, and 308c together may suppress warpage of third material layers (e.g., 33 in FIG. 15) in the slimming region during a subsequent process.

After the first support layer 308 and 308a has been completely formed in first slits SL1, the first slit mask pattern 307 and first support layer 308 and 308a may be partially exposed by a planarization operation CMP until the hard mask 302 is exposed.

Figure 10:
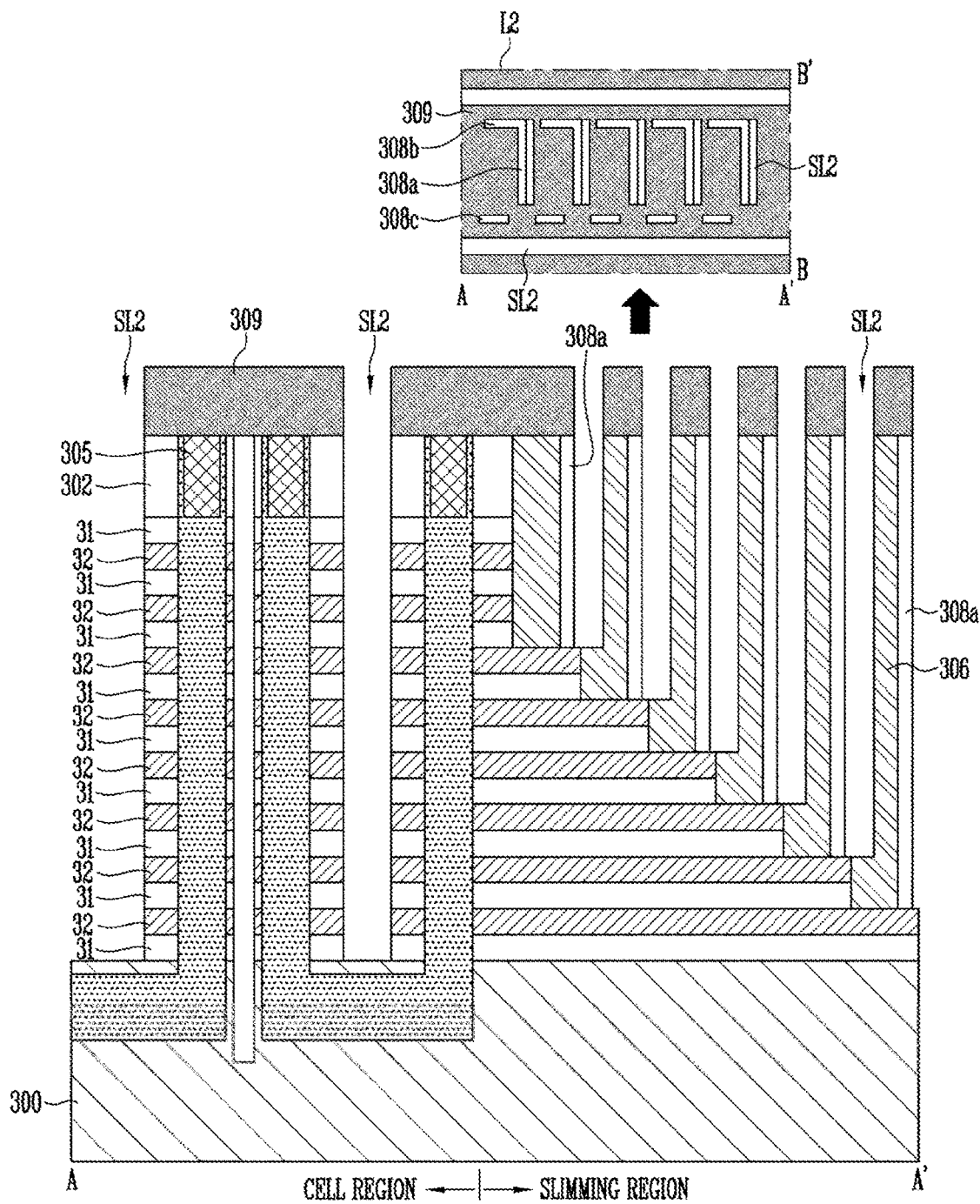

Referring to FIG. 10, a second slit mask pattern 309 may be formed over a surface of the resultant structure of the step illustrated in FIG. 9. The layers may be partially removed in a similar manner to that mentioned above in connection to FIG. 9. In this way, second slits SL2 may be formed in the cell region and slimming region. For example, in the cell region, the second slit SL2 may vertically pass through the first and second material layers 31 and 32 between the vertical portions of the vertical structure 303. In the slimming region, the second slit SL2 may be formed along the direction to which the first support layer 308a is arranged.

In the slimming region, the second slits SL2 may be included in a second layout L2 (e.g., A-A' and B-B' plane). With reference to the second layout, each of the second slits SL2 may be linear in the A-A' direction. Further, each of the second slits SL2 may be formed in the B-B' direction to expose each of the first support layers 308a. Through the linear second slits SL2 extending in the A-A' direction, the first and second material layers 31 and 32 may be exposed at a sidewall thereof.

Figure 11:
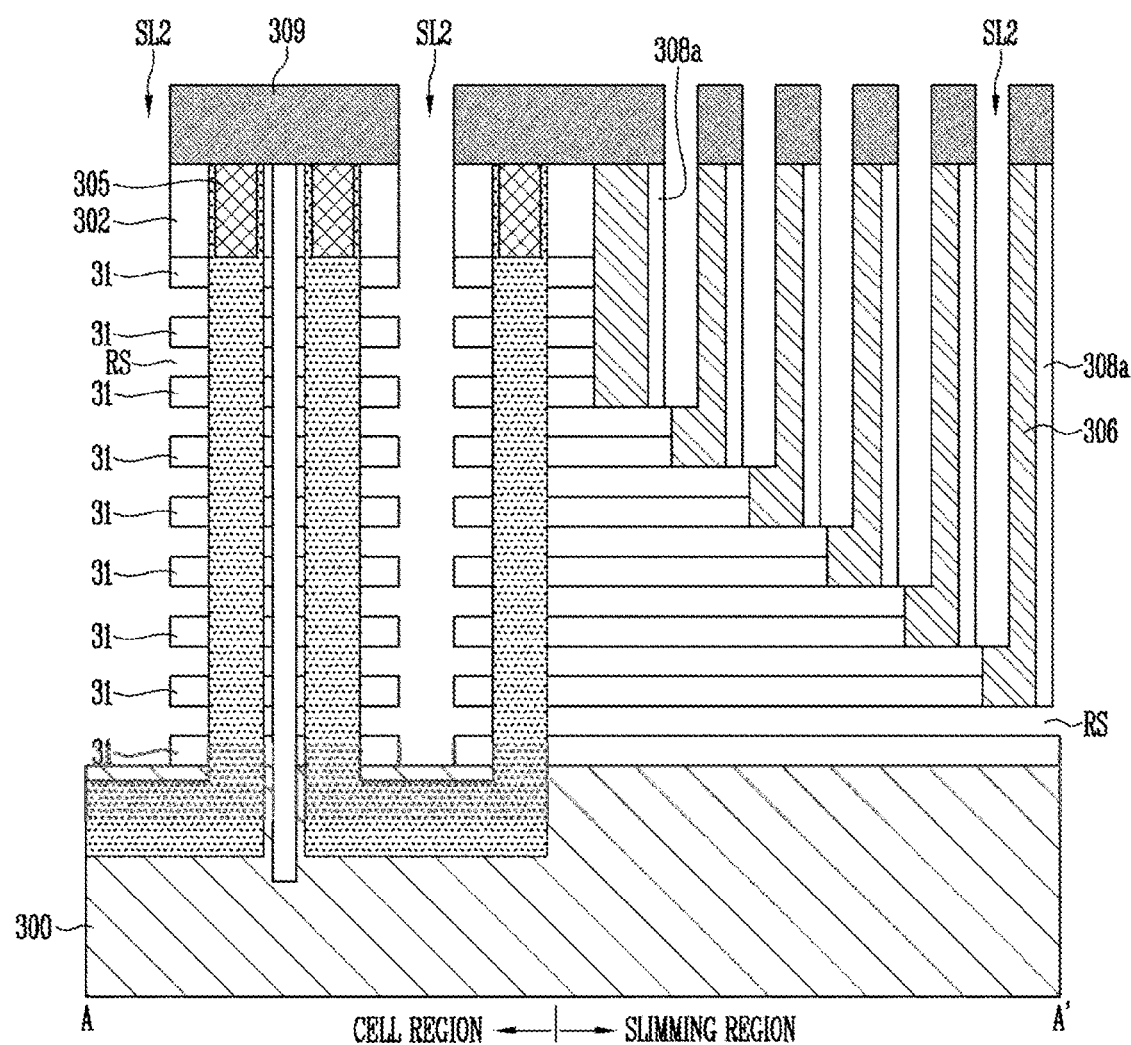

Referring to FIG. 11, a cleaning operation may be carried out to remove the second material layers 32 through the second slits SL2. In this way, each of recess regions RS may be formed between the first material layers 31. In an embodiment, the cleaning operation may include a wet cleaning operation employing an etchant more selective to the second material layers 32 than the first material layers 31. For example, the etchant may be more selective to the nitride layer than the oxide layer.

Figure 12:
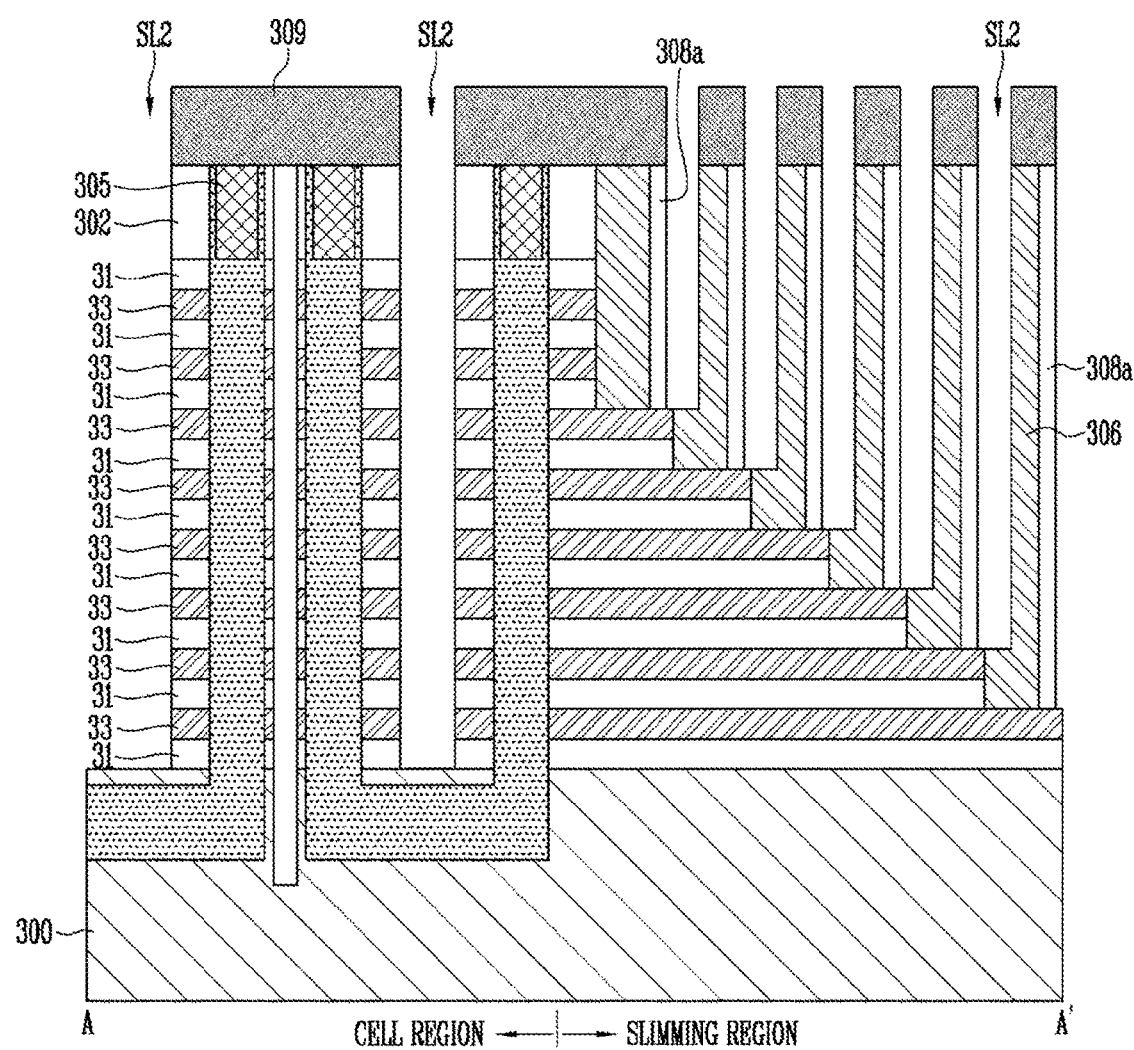

Referring to FIG. 12, through the second slits SL2, the third material layers 33 may fill the recess regions RS. The third material layers 33 may be made of a conductive material for a gate line. The third material layers 33 may act as word lines and select lines. For example, the third material layers 33 may include tungsten W.

After the recess regions RS are filled with the third material layers 33, a third etching operation may be carried out to remove the underlying layers through the openings of the second slit mask pattern 309, and the second slits SL2 may be formed again in the cell region and slimming region.

Figure 13:
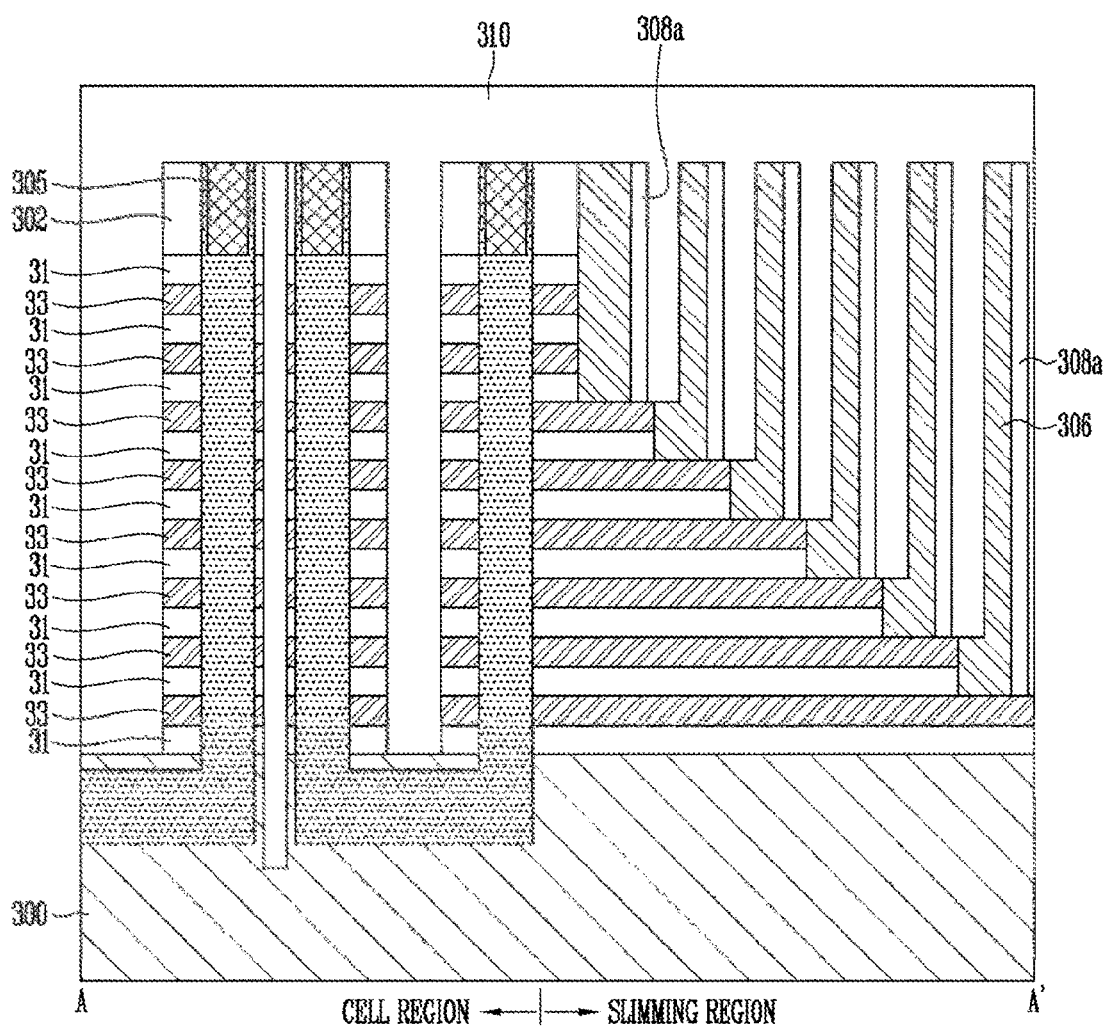

Referring to FIG. 13, a second interlayer insulating layer 310 may be formed over the resultant structure of the step illustrated in FIG. 12. The second interlayer insulating layer 310 may be made of an oxide layer. The second slits SL2 may be filled with an interlayer insulating layer 310.

Figure 14:
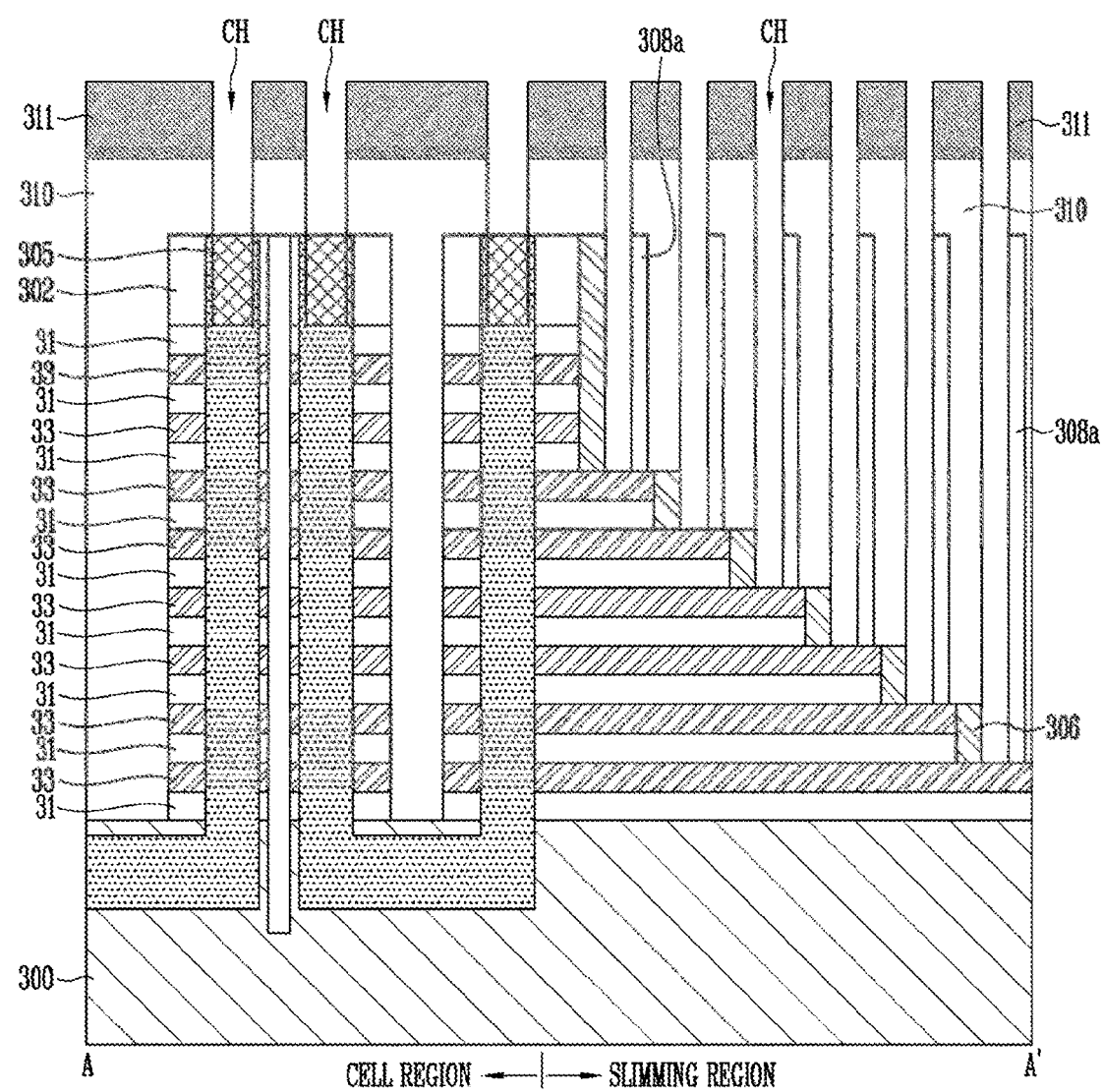

Referring to FIG. 14, a contact mask pattern 311 may be formed over the second interlayer insulating layer 310. The contact mask pattern 311 may have openings respectively corresponding to contact holes CH, which will be formed later. A fourth etching operation may be carried out by using the contact mask pattern 311 as an etching mask to form the contact holes CH in the cell region and slimming regions. For example, in the cell region, the first conductive layer 305 may be exposed through the contact holes CH. In the slimming region, the third material layers 33 may be exposed through the contact holes CH.

Figure 15:
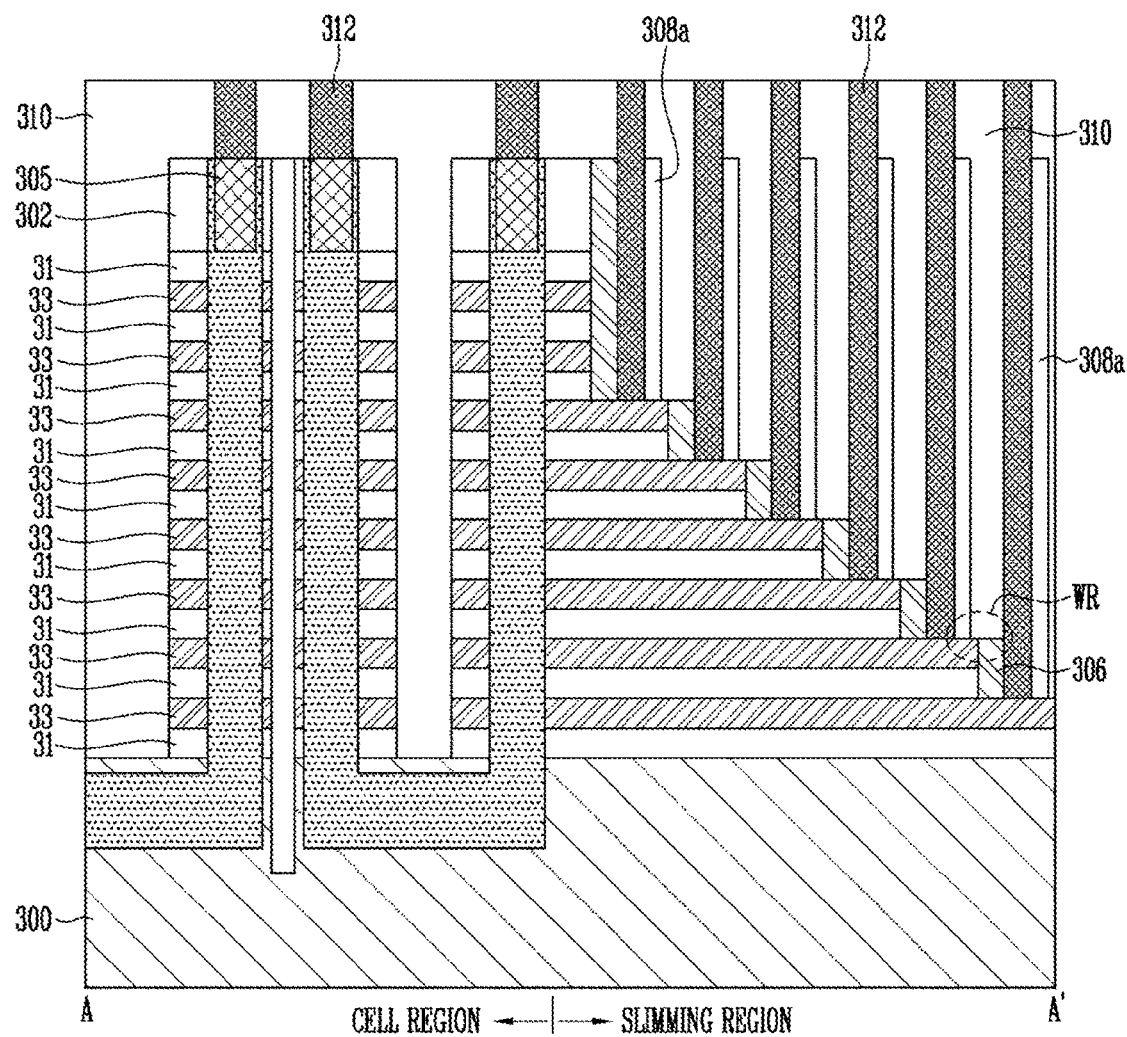

Referring to FIG. 15, a second conductive layer 312 for a contact plug may be formed in the contact holes CH. The second conductive layer 312 may contact the first conductive layer 305 in the cell region. In the slimming region, the second conductive layer 312 may contact the third material layers 33. Next, a planarization operation (CMP) may be carried out until the second interlayer insulating layer 310 is exposed.

In an embodiment, in the slimming region, the multiple of the slits SL1 and SL2 may be formed, and the support layers may be formed in the slits SL1 and SL2. The support layers may reduce the probability that the third material layers 33 will be bent while the contact holes CH are being formed, and thus may improve the reliability of memory device.

Figure 16:
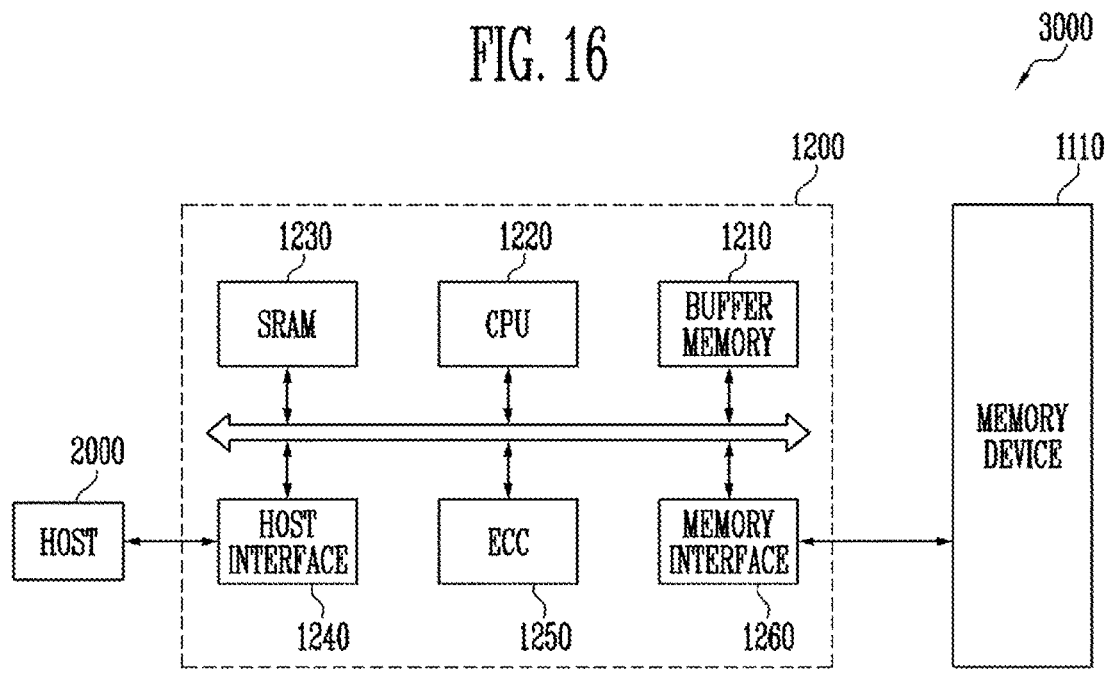
FIG. 16 is a diagram illustrating an example of a memory system according to an embodiment of the present disclosure.

FIG. 16 illustrates a block diagram of a memory system according to an embodiment of the present disclosure.

Referring to FIG. 16, the memory system 3000 according to an embodiment of the present disclosure may include the memory device 1100 to store therein data, and the memory controller 1200 to control the memory device 1100. Further, the memory controller 1200 may control a communication between a host 2000 and the memory device 1100. The memory controller 1200 may include a buffer memory 1210, a CPU 1220, a SRAM 1230, a host interface 1240, an error correction code (ECC) module 1250, and a memory interface 1260.

The buffer memory 1210 may temporarily store data while the memory controller 1200 controls the memory device 1100. The CPU 1220 may control data exchange for the memory controller 1200. The SRAM 1230 may act as a work memory for the CPU 1220. The host interface 1240 may have a data exchange protocol for a host 2000 coupled to the memory system 3000. The ECC module 1250 may detect and correct errors in data read from the memory device 1100. The memory interface 1260 may interface with the memory device 1110. Further, although not illustrated in FIG. 16, the memory system 3000 may further include a ROM to store code data to interface with the host system or host 2000.

In an embodiment, the host 2000 working together with the memory system 3000 may include, but not be limited to, a computer, ultra mobile PC (UMPC), workstation, netbook, PDA, portable computer, web tablet, wireless phone, mobile phone, smart phone, e-book, portable multimedia player (PMP), portable game player, navigation device, black box, digital camera, three-dimensional television, digital audio recorder, digital audio player, digital picture recorder, digital picture player, digital video recorder, digital video player, at least one electronic device with a wireless data communication, at least one electronic device as a home networking component, at least one electronic device as a computer networking component, at least one electronic device as a telematics networking component, at least one electronic device as a computing system component, or the like.

Figure 17:
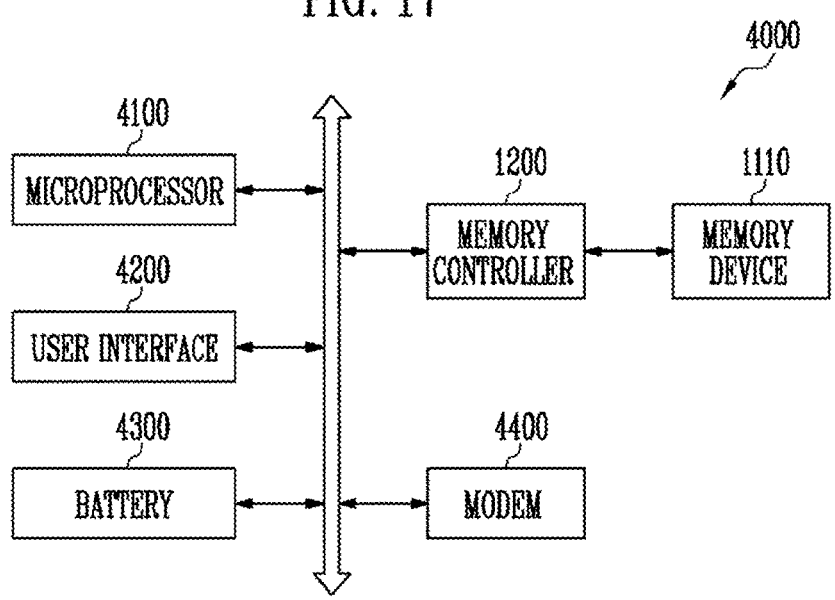
FIG. 17 is a diagram illustrating an example of a computing system including a memory system according to an embodiment of the present disclosure.

FIG. 17 is a schematic of a computing system including a memory system according to an embodiment of the present disclosure.

Referring to FIG. 17, the computing system 4000 according to an embodiment of the present disclosure may include the memory device 1110, the memory controller 1200, a microprocessor 4100, a user interface 4200, and a modem 4400, all of which are electrically connected to each other via a system bus. Further, when the computing system 4000 is implemented in a mobile device, the computing system 4000 may be further provided with a battery (not shown) to supply an operation voltage thereof. The computing system 4000 may be further provided with an application chipset, camera image processor (CIS), mobile DRAM, etc. The memory controller 1200 and the memory device 1110 together may form a solid state drive (SSD).

The memory system (e.g., the memory device 1110 and the memory controller 1200) in the computing system 4000 may be packaged in various forms such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board COB, Ceramic Dual In Line Package (CERDIP), Plastic Metric Quad Flat Pack (MQFP), Thin Quad Flatpack (TQFP), Small Outline SOIC, Shrink Small Outline Package (SSOP), Thin Small Outline TSOP, Thin Quad Flatpack (TQFP), System In Package (SIP), Multi Chip Package (MCP), Wafer-level Fabricated Package (WFP), Wafer-Level Processed Stack Package (WSP) and the like.

The above description is not to be taken in a limiting sense, but is made merely for the purpose of describing the general principles of example embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A method of manufacturing a semiconductor device, comprising:

providing a multilayered structure in which different material layers are alternately stacked over a substrate;

etching partially the material layers to form a multi-step structure, each step being formed of at least one pair of the material layers;

forming an interlayer insulating layer to cover the multi-step structure;

forming first slits, each first slit vertically passing through the interlayer insulating layer and partially exposing a top face of each step;

forming vertical support layers by filling the first slits with an insulating material for the vertical support layers, each vertical support layer being disposed on a top surface of each step;

forming second slits vertically passing through the interlayer insulating layer to expose sidewalls of the material layers;

removing partially the material layers to form recesses;

filling the recesses with a conductive material to form gate lines, the gate line defining an upper portion of the step; and forming vertical contact plugs respectively on the upper portion of the step.

2. The method of claim 1, wherein each of the first slits includes a L-shaped slit.

3. The method of claim 2, wherein each of the first slits further includes a linear slit spacedly arranged to the L-shaped slit.

4. A method of manufacturing a memory device, comprising:
- providing a multilayered structure in which first and second material layers are alternately stacked over a substrate, the substrate being divided into cell and slimming regions;
- etching partially the first and second material layers in the slimming region to form a multi-step structure, each step including the second material having a partially exposed top surface;
- forming a first interlayer insulating layer to cover the multi-step structure;
- etching partially the first interlayer insulating layer to form first slits, each first slit partially exposing a top surface of the second material of each step;
- filling the first slits to form first support layers;
- forming second slits in the cell and slimming regions, the second slits exposing sidewalls of the first and second material layers;
- removing the second material layers through the second slits to form recesses;
- filling the recesses with third material layers to form gate lines, each of the third material layers defining an upper portion of each step;
- forming contact holes, each contact hole partially exposing the upper portion of each step; and
- filling the contact holes with a conductive material to form contact plugs.

5. The method of claim 4, wherein each of the first material layers is made of an oxide layer, and each of the second material layers is made of a nitride layer.

6. The method of claim 4, wherein each of the first slits includes a L-shaped slit.

7. The method of claim 4, wherein forming the second slits further comprises forming the second slits along a direction to which the first support layers are arranged.

8. The method of claim 7, wherein the second slits exposing sidewalls of the first and second material layers and the second slits formed along a direction to which the first support layers are arranged are formed at the same time using an etching process.

9. The method of claim 7, further comprising forming a second interlayer insulating layer in the second slits formed along a direction to which the first support layers are arranged.

10. The method of claim 4, wherein the third material layers are made of a conductive material.

11. The method of claim 4, wherein each of the first support layers is made of an oxide layer having a different etching rate from that of the first interlayer insulating layer.

12. The method of claim 11, wherein the first support layers have a lower etching rate than that of the first interlayer insulating layer.

13. A method of manufacturing a memory device, comprising:
- forming a multi-step structure;
- forming first slits exposing top surfaces of the steps of the multi-step structure;
- filling the first slits with first interlayer insulating layers to form vertical support layers, wherein the vertical support layers are disposed on top surfaces of the steps;
- forming second slits along the direction to which the vertical support layers are arranged, the second slits exposing first side walls of the vertical support layers;
- filling the second slits with second interlayer insulating layers;
- forming contact holes exposing second side walls of the vertical support layers; and
- forming conductive layers in the contact holes.

14. The method of claim 13, wherein forming the vertical support layers comprises:
- forming an interlayer insulating layer to cover the multi-step structure;
- forming the first slits, each of the first slits vertically passing through the interlayer insulating layer and partially exposing a top face of the step; and
- filling the first slits with an insulating material to form the vertical support layers.

15. The method of claim 14, wherein each of the first slits includes an L-shaped slit.

16. The method of claim 15, wherein each of the first slits further includes a linear slit spacedly arranged to the L-shaped slit.

* * * * *